June 5, 1956 C. P. CARDANI 2,748,388

COMPONENT INSERTING MACHINES

Filed Feb. 8, 1955

Inventor
Charles P. Cardani
By his Attorney 2,748,388

COMPONENT INSERTING MACHINES

Charles P. Cardani, Hamilton, Mass., assignor to United Shoe Machinery Corporation, Flemington, N. J., a corporation of New Jersey Application February 8, 1955, Serial No. 486,764

4 Claims. (Cl. 1—2)

This invention relates to machines for bending and then applying the leads of electrical components to predetermined portions of work pieces. More particularly, the invention is concerned with providing improvements in machines for feeding, cutting, and forming the coaxial leads of successive electronic components better to direct said leads for endwise insertion into the preformed holes of chassis, for example, the holes of wiring boards which bear printed circuits. The invention is accordingly herein illustrated as embodied in an electronic component inserting machine of the type disclosed in a copending application bearing Serial No. 458,312, and filed September 27, 1954, in the names of Leon D. Alderman, Charles P. Cardani, Edwin S. Kant, and Henry B. Kimball. It will be appreciated that this invention is not limited in its application to a machine of that character, nor is it necessarily restricted in use to the insertion of lead wire.

In doing assembly work by mechanically presenting components to one side of printed wiring boards or other chassis customarily forming a part of radio, television, or other electronic equipment, the number of parts already applied and their sizes frequently prevent the major portion of a machine head from safely coming closer than one and one-half inches from the point at which a component must be applied by its terminals. This means that the cutting and forming instrumentalities of a component inserting machine head should preferably prepare the leads for endwise ejection therefrom when they are spaced at least one and one-half inches from the wiring board holes adapted to receive them. Since the clearance afforded by these holes is quite small, perhaps of the order of a few thousandths of an inch, in the interest of effective soldering operations which ordinarily follow, and since the rather soft copper leads of the components to be applied are seldom straight but are inconsistently bent at one or more points externally of the component bodies, special precaution must be taken to insure that an inserting machine will unfailingly form and effectively apply the leads of successive components with a high degree of accuracy and uniformity.

In the light of the foregoing it is a principal object of this invention to provide a reliable, high capacity component inserting machine having improved means for severing and forming the coaxial leads of successive components to insure their accurate endwise application to a chassis. To this end and in accordance with a feature of the invention, the illustrative machine includes in its organization the novel combination of a pair of outside formers having lead receiving grooves, an inside former, and a driver bar, all substantially as disclosed in the above-mentioned application, and a pair of cutter bars respectively disposed outwardly of said outside formers to sever the leads in preparation for their forming, said cutter bars each having formed on their lead engaging ends a deflecting surface preferably V-shaped and providing an apex in register with the lead receiving groove of the adjacent outside former. In employing a machine embodying this invention for the insertion of coaxial leads of electronic components having cylindrical bodies, as is common for example in the case of many resistors, condensers, etc., the apexes of said cutter bars will normally be arranged in, or shiftable into, a straight line with the lower portions of the outside former grooves, and adapted to sever the respective leads by shearing them substantially on the axis of the component body.

The invention will now be described with more particularity in connection with an illustrative embodiment, namely, a machine of the type fully disclosed in the above cited application, and with reference to the accompanying drawings, in which Fig. 1 is a view in front elevation of the lower portion of a component inserting machine head, a portion being broken away to show construction detail, said head having its parts in normal starting position in relation to an anvil, and a wiring board fragment which is to receive a coaxial lead type component;

Figures 1, 2, 3, 4:
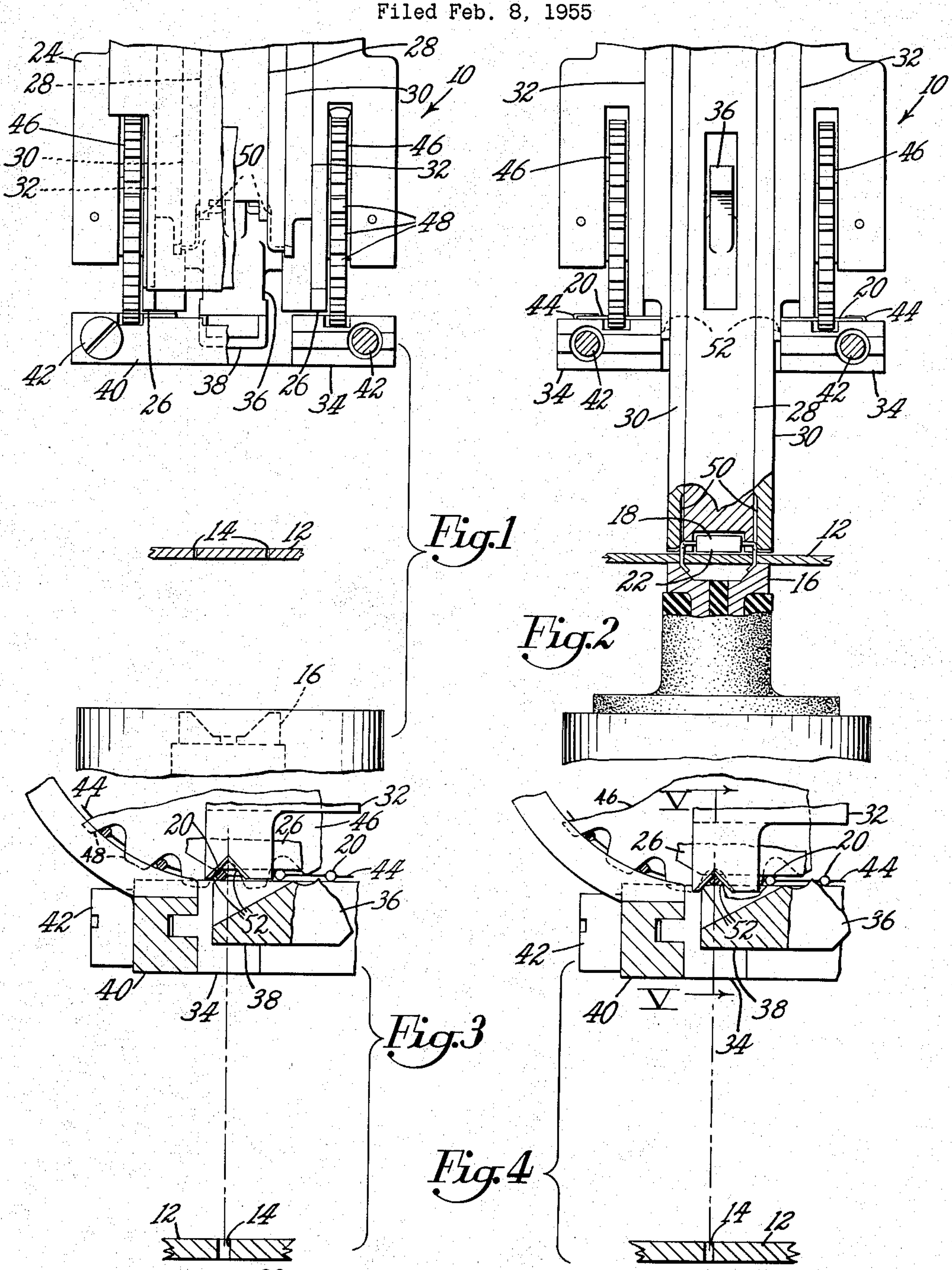
Fig. 2 is a view corresponding to Fig. 1 but partly in section and showing the operating parts at that subsequent part of the cycle in which the cut, formed, and inserted leads are being clenched.
Fig. 3 is a view in side elevation and partly in section, and on an enlarged scale, showing certain of the parts seen in Fig. 1, but at that point in a cycle at which the lower end of a cutter bar initially engages a lead to be positioned and severed.
Figure 5:
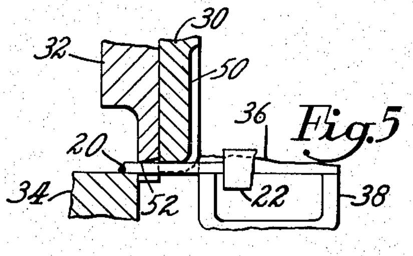

Fig. 4 is a view corresponding to Fig. 3, but indicating the cutter bar an instant later in the machine cycle, the lead having been properly positioned by the cutter bar and about to be sheared thereby for forming; and Fig. 5 is a section taken on the line V—V of Fig. 4 and showing the alinement of the lead (just prior to its being shorn) with the lead receiving groove of the adjacent outside former.

As fully described in the application referred to above, a component inserting machine head herein generally designated 10 (Figs. 1 and 2) is mounted for heightwise adjustment relatively to a work piece such as a wiring board 12 having preformed lead receiving holes 14, 14 and bearing a printed circuit (not herein shown). The board 12 may be supported and positioned by any suitable means (none being shown herein) with respect to the head 10 and a vertically reciprocable anvil 16 cooperative with the head. Coaxial lead type electronic components 18 (the one shown in Fig. 2 has been formed from a coaxial condition) which are to have their leads 20, 20 respectively inserted endwise into and thrust through the holes 14, 14 must normally first be successively fed sidewise to the head to have their leads shortened to appropriate length and then bent, for instance in staple fashion, to permit the lead legs to extend downwardly for subsequent movement into said holes. Though some points of similarity thus exist between such component inserting and the stapling art, and hence between the lead forming mechanism of the head 10 and the staple forming mechanism of the stapling machines adapted to form and insert staples that are produced from a continuous length of wire, there are certain marked distinctions which it is well to note briefly in order more fully to appreciate the present invention. As commercially supplied, the leads 20, 20, in contrast to staple wire, are soft and easily bent; hence, they usually assume various configurations and rarely lie throughout their length on the axis of their respective component bodies. The latter, moreover (one designated 22 in Fig. 2) may be fragile and susceptible of having their electrical characteristics altered by improper handling in machines. These considerations dictate, as set forth in the above-identified Alderman et al. application, that it is essential to good design in a component inserting machine to feed the successive discrete components by their leads and avoid harmful contact with or influence on their bodies. Upon being severed, therefore, the leads 20, 20 must be bent a predetermined distance from their component body 22, and the body thereafter carefully deposited upon the board 12 without having the unbent lead portions transmitting appreciable force to the body during clenching of the inserted lead ends. The further important distinction over stapling art, and to which the present invention is especially directed as will be explained, is that it is critical to the production of effective electrical connections with the terminal portions of both lead legs 20, 20 that they must each, after one and one-half or more inches of endwise travel, and regardless of their original degree of straightness, be threaded through the small holes 20, 20 respectively.

The head 10 comprises a rectangular casing 24 which, with a front cover plate (not shown) normally encloses lead cutting and forming instrumentalities, the lower portions only of which are shown in the drawings. Centrally disposed within the casing is a vertically reciprocable driver bar 28 and lead forming mechanism including a pair of vertically reciprocable outside formers 30, 30 spaced at opposite sides of the driver bar, and a pair of independently reciprocable cutter bars 32, 32 respectively spaced outwardly of the outside formers from the driver bar. A pair of spaced shear blocks 34, 34 (Fig. 2) is secured to the bottom of the casing and adapted to cooperate with the cutter bars 32, 32, as will be described. For releasably supporting successive components to be formed and applied the head 10 further includes an inside former 36 pivotally mounted on a horizontal pin not shown but affixed in the casing 24. As shown in Figs. 1, 3 and 4, when the machine is in rest condition and up to and including that point in a cycle of operations at which lead shearing occurs, a lower U-shaped end 38 of the inside former is in position to receive and support a component 18 by spaced engagements with its leads adjacent to the body 22.

While any suitable means may be used to supply the head 10 with successive components to be inserted, it will suffice for present purposes to show and describe only a small portion of the feeding mechanism disclosed in the aforementioned application. Thus, an inclined raceway 40 having a base affixed to the shear blocks 34, 34 by screws 42, 42 and having an arcuate delivery end is arranged to guide, from a suitable source of supply, a row of components in side by side relation so that they emerge with their leads contacting the upper surface of said blocks. Spaced portions 26, 26 (Figs. 2 and 3) of the casing 24 overlie intermediate portions of the leads within the head to hold them substantially in a horizontal plane and on the blocks 34, 34. Figs. 2, 3 and 4 indicate that the components are belted in a row by means of tapes 44, 44 extending transversely of the leads and folded over their ends, but it will be understood that no linking together of the components is required, such packaging merely being helpful in some respects, such as conducting the severed and unused lead ends away from the operating zone and thus insuring that they will not foul a chassis. As disclosed in the Alderman et al. application a pair of rotary feed wheels 46, 46 adjacent to the arcuate portion of the raceway 40 is mounted on a shaft journaled in the casing 24 and arranged to engage outer portions of the leads. The wheels are operated to assist in accurately advancing and positioning those leads of the components which are about to be formed. For this purpose the wheels have the same number of evenly spaced teeth 48. The wheels are intermittently driven in phase and arranged so that successive bottommost pairs of peripheral grooves or centralizing notches between adjacent teeth 48 will position the endmost leads then being accommodated thereby in exact register with the cutting and forming instrumentalities, and more particularly, with forming grooves 50, 50 (Figs. 1 and 5) respectively provided on the inside and bottom of the lower ends of the outside formers.

The construction thus far explained has been found to operate quite well but with an insufficiently high degree of reliability in some electronic assembly work. Occasional inserting misses or defective insertions seemingly are attributable to the fact that one or both intermediate portions of oppositely extending leads about to be cut and formed and extending between a feed wheel 46 and the driver bar 28 are not coincident with the axis of the component body nor always accurately alined with the plane of the forming grooves 50, 50. In order better to control the leads of successive endmost components about to be formed and thus insure that the ends of the severed and formed lead portions can invariably be thrust endwise into the holes 14, 14 the cutter bars 32 are respectively provided at their lower ends with an inverted V-shaped surface 52 (Figs. 3, 4 and 5), the apex of which is exactly alined with both the forming grooves 50, 50 and the "bottoms" of the feed wheel centralizing notches acting on the outer portions of the leads. As shown in Figs. 3 and 4, a plane containing the axes of the holes 14, 14 contains the vertices of the surfaces 52, 52. The arrangement is such that in each cycle outer portions of the endmost leads will be alined with the grooves 50, 50 by the wheels 46, 46 and just before severance of the more inward lead portions to be formed and inserted, the ends of the latter will be alined with said grooves 50 by the camming or deflecting action, if necessary, of the sides of the V-shaped surface 52, said sides preferably being disposed at about 45° to the vertical or with respect to the path of the cutter bars. Fig. 4 illustrates the manner in which a crooked lead about to be severed for forming has been centralized in its intermediate portion, i. e., brought into planar and substantially coaxial relation corresponding with the grooves 50, 50 (as compared with its position indicated in Fig. 3) by a cutter bar surface 52.

After severance of oppositely extending leads by a further lowering of the cutter bars beyond their position indicated in Fig. 4, apex portions of the surfaces 52 having then cooperated with the blocks 34, 34, the outside formers 30, 30 descend in their usual way toward the wiring board. As the lead portions to be inserted are being formed over the retractable inside former 36 they must remain wholly within the grooves 50, 50, and hence in the plane of the axes of the holes 14, 14; this condition continues when soon thereafter the driver bar 28 descends to engage unbent lead portions adjacent opposite ends of the component body and finally advances relatively to the outside formers to deposit the body on the board and to thrust the leads endwise through the holes 14 respectively. The cycle of operations is accordingly about as disclosed in said application, but it will be understood that the anvil 16 may be moved upwardly to effect lead clenching either after the leads fully protrude from the wiring board holes or during the course of their being thrust through these holes.

From the above it will be seen that successive components have their leads positioned in the machine head and in the plane of lead forming and insertion first by a general alinement effected at their remote disposable end portions and then, just prior to acting on the intermediate lead portions to be formed, by a precise alinement by means of the cutter bars at points adjacent to where lead forming is to occur.

Having thus described my invention, what I claim as new and desire to secure by Letters Patent of the United States is:

1. In a component inserting machine, a head movable into register with a pair of lead receiving holes formed in a chassis, lead forming mechanism in said head operable on the oppositely extending leads of successive coaxial components at predetermined distances from their bodies, said mechanism including two lead-receiving grooves lying in the plane containing the axes of said chassis holes, a pair of spaced cutters arranged in said head exteriorly of said mechanism and actuable to sever the successive leads to be formed thereby, each of said cutters having a lead deflecting surface arranged to engage and aline a lead in the plane of said grooves prior to severance, and a driver bar reciprocable in said head and cooperative with said forming mechanism to move the severed and formed leads endwise from said grooves and into said lead receiving holes respectively.

2. In a machine for inserting components of the type having generally coaxial leads extending from their bodies the combination with mechanism for forming said leads in a plane, means for feeding successive components to said mechanism, and means for moving each formed component substantially in its plane to effect lead insertion endwise, of lead cutting mechanism operable to sever the leads of a component before they are formed by said forming mechanism, said lead cutting mechanism including spaced cutting members respectively having V-shaped lead deflecting surfaces adjacent to the lead forming mechanism and having vertices lying in said plane of forming.

3. In a machine for inserting in a chassis electronic components having generally coaxial leads extending from their bodies, a machine head, lead forming mechanism in said head including outside formers and a driver bar projectable from a lead forming zone therein, out of the head and toward the chassis, said formers respectively having forming grooves lying in a common plane that contains lead receiving holes preformed in said chassis, means associated with said head for advancing successive components sidewise into the forming zone to be formed, the advancing means including centralizing notches effective to engage and aline outer portions of the leads of each component with respect to said forming grooves, and a pair of cutter bars movably mounted in the head between the advancing means and lead forming mechanism, respectively, each of said cutter bars having a V-shaped lead alining surface arranged to sever at its vertex an intermediate lead portion to be formed by one of said forming grooves, the vertices of said V surfaces being shiftable into line with the effective centralizing notches and said forming grooves to insure that the cut ends of the formed leads will be directed endwise into said chassis holes during projection of said outside formers and driver bar beyond said head.

4. In a machine adapted to insert the coaxial leads of components into spaced chassis holes and having mechanism for forming said leads for parallel insertion, feeding means having a plurality of centralizing notches for advancing successive components sidewise substantially into register with said forming mechanism, said notches being arranged on opposite sides of the forming mechanism to engage outer portions of the successive leads, and means acting on intermediate portions of the successive leads thus substantially registered with the forming mechanism more precisely to effect their register therewith prior to operation of said forming mechanism.

References Cited in the file of this patent

UNITED STATES PATENTS 1,516,191 Hotchkiss -------------- Nov. 18, 1924